US012405297B2

(12) United States Patent
Dayton et al.

(10) Patent No.: US 12,405,297 B2
(45) Date of Patent: Sep. 2, 2025

(54) DIAGNOSTIC CIRCUIT

(71) Applicant: The Boeing Company, Arlington, VA (US)

(72) Inventors: Ian M. Dayton, Arlington, VA (US); Mark Edward Nowakowski, Arlington, VA (US)

(73) Assignee: The Boeing Company, Arlington, VA (US)

( * ) Notice: Subject to any disclaimer, the term of this patent is extended or adjusted under 35 U.S.C. 154(b) by 182 days.

(21) Appl. No.: 18/335,790

(22) Filed: Jun. 15, 2023

(65) Prior Publication Data

US 2024/0418762 A1 Dec. 19, 2024

(51) Int. Cl.
*G01R 29/26* (2006.01)
(52) U.S. Cl.
CPC .................... *G01R 29/26* (2013.01)
(58) Field of Classification Search
CPC .............................. G01R 29/26; G01R 31/002
USPC .................................. 324/105, 76.11, 76.75
See application file for complete search history.

(56) References Cited

U.S. PATENT DOCUMENTS

| 5,969,517 A | 10/1999 | Rao | |
|---|---|---|---|
| 10,718,805 B2 * | 7/2020 | Gregory | G01R 31/001 |
| 2010/0033164 A1 * | 2/2010 | Ker | G01R 19/0053 |
| | | | 324/102 |
| 2012/0019236 A1 | 1/2012 | Tiernan | |
| 2015/0236503 A1 * | 8/2015 | Zhu | H02H 9/046 |
| | | | 361/56 |
| 2017/0102440 A1 | 4/2017 | Chen | |
| 2018/0026737 A1 * | 1/2018 | Kucheravy | H04L 1/248 |
| | | | 375/227 |
| 2020/0132754 A1 * | 4/2020 | Lagler | G01R 31/2879 |
| 2022/0163580 A1 * | 5/2022 | Byrd | G01R 31/14 |

OTHER PUBLICATIONS

U.S. Appl. No. 18/335,804, filed Jun. 15, 2023.
U.S. Appl. No. 18/335,821, filed Jun. 15, 2023.
Aaron Lee, et al., "Finding and Eliminating Noise and Interference in a Test Stand for Josephson Digital Chips," in IEEE Transactions on Applied Superconductivity, vol. 31, No. 5, pp. 1-5, Aug. 2021.

* cited by examiner

*Primary Examiner* — Giovanni Astacio-Oquendo
(74) *Attorney, Agent, or Firm* — Harrity & Harrity, LLP

(57) ABSTRACT

A diagnostic circuit includes a superconducting quantum interference device (SQUID) configured to be coupled to a test circuit such that an electronic noise present in the test circuit induces a first current that flows through the SQUID. The diagnostic circuit also includes a current path configured to receive a second current that flows through the SQUID. The SQUID is configured to generate an output in a form of: a first voltage in response to a sum of the first current and the second current being less than a threshold current and a second voltage in response to the sum of the first current and the second current being greater than the threshold current.

20 Claims, 17 Drawing Sheets

IDENTIFYING THE MAGNITUDES OF THE SECOND CURRENTS THAT DO NOT CORRESPOND TO THE GAUSSIAN DISTRIBUTION

PERFORMING STEPS (A), (B), AND (C) A SECOND TIME, WHEREIN THE SECOND TIME PERFORMING STEP (B) COMPRISES INCREASING THE MAGNITUDE AT A SECOND RATE THAT IS GREATER THAN THE FIRST RATE

PERFORMING STEPS (B), (C), AND (D) A SECOND TIME, WHEREIN THE SECOND TIME PERFORMING STEP (C) COMPRISES INCREASING THE MAGNITUDE AT A SECOND RATE THAT IS GREATER THAN THE FIRST RATE

(A) GENERATING, FOR EACH SUPERCONDUCTING QUANTUM INTERFERENCE DEVICE (SQUID) OF A FIRST ARRAY OF SQUIDS AND A CORRESPONDING TEST CIRCUIT OF A SECOND ARRAY OF TEST CIRCUITS, A FIRST CURRENT WITHIN THE SQUID IN RESPONSE TO DETECTING AN ELECTRONIC NOISE WITHIN THE TEST CIRCUIT

302

(B) INCREASING, FOR EACH SQUID OF THE FIRST ARRAY, A MAGNITUDE OF A SECOND CURRENT THAT FLOWS THROUGH THE SQUID WHILE GENERATING THE FIRST CURRENT

304

(C) DETERMINING, FOR EACH SQUID OF THE FIRST ARRAY, THE MAGNITUDE OF THE SECOND CURRENT AT WHICH AN OUTPUT OF THE SQUID TRANSITIONS FROM A FIRST VOLTAGE TO A SECOND VOLTAGE

IDENTIFYING, FOR EACH TEST CIRCUIT OF THE SECOND ARRAY, THE MAGNITUDES OF THE SECOND CURRENTS THAT CORRESPOND TO A GAUSSIAN DISTRIBUTION

IDENTIFYING, FOR EACH TEST CIRCUIT OF THE SECOND ARRAY, THE MAGNITUDES OF THE SECOND CURRENTS THAT DO NOT CORRESPOND TO THE GAUSSIAN DISTRIBUTION

PERFORMING STEPS (A), (B), AND (C) A SECOND TIME, WHEREIN THE SECOND TIME PERFORMING STEP (B) COMPRISES INCREASING THE MAGNITUDE AT A SECOND RATE THAT IS GREATER THAN THE FIRST RATE

DIAGNOSTIC CIRCUIT

FIELD

The present disclosure generally relates to a diagnostic circuit, and more specifically to a diagnostic circuit configured to analyze electronic noise in a test circuit.

BACKGROUND

In some applications, complementary metal-oxide-semiconductor (CMOS) circuits operate at cryogenic temperatures (e.g., less than or equal to 4 K corresponding to liquid helium or less than or equal to 77 K corresponding to liquid nitrogen). Identifying sources of electronic noise is helpful in troubleshooting such cryogenic circuits, however current methods of analyzing noise from cryogenic circuits have some disadvantages. Conventional methods involve collecting signals in the cryogenic environment and inspecting them for electronic noise with equipment that is operating at room temperature. The process of transmitting signals from the cryogenic environment to room temperature introduces more thermal noise. As a result, the noise from the cryogenic environment can be difficult to isolate from the noise from the room temperature environment or from transmission line noise along the thermal gradient between the cryogenic and room temperature environments. Accordingly, a need exists for improved diagnostic circuits and improved diagnostic methods for analyzing electronic noise in cryogenic environments.

SUMMARY

One aspect of the disclosure is a diagnostic circuit comprising: a superconducting quantum interference device (SQUID) configured to be coupled to a test circuit such that an electronic noise present in the test circuit induces a first current that flows through the SQUID; and a current path configured to receive a second current that flows through the SQUID, wherein the SQUID is configured to generate an output in a form of: a first voltage in response to a sum of the first current and the second current being less than a threshold current, and a second voltage in response to the sum of the first current and the second current being greater than the threshold current.

Another aspect of the disclosure is a method of operating a diagnostic circuit, the method comprising: (a) generating a first current within a superconducting quantum interference device (SQUID) in response to the SQUID detecting an electronic noise within a test circuit; (b) increasing, while generating the first current, a magnitude of a second current that flows through the SQUID; and (c) determining the magnitude of the second current at which an output of the SQUID transitions from a first voltage to a second voltage.

By the term "about" or "substantially" with reference to amounts or measurement values described herein, it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

The features, functions, and advantages that have been discussed can be achieved independently in various examples or may be combined in yet other examples further details of which can be seen with reference to the following description and drawings.

BRIEF DESCRIPTION OF THE DRAWINGS

The novel features believed characteristic of the illustrative examples are set forth in the appended claims. The illustrative examples, however, as well as a preferred mode of use, further objectives and descriptions thereof, will best be understood by reference to the following detailed description of an illustrative example of the present disclosure when read in conjunction with the accompanying Figures.

FIG. 13 is a block diagram of a method, according to an example.

FIG. 14 is a block diagram of a method, according to an example.

FIG. 19 is a block diagram of a method, according to an example.

FIG. 20 is a block diagram of a method, according to an example.

FIG. 22 is a block diagram of a method, according to an example.

FIG. 23 is a block diagram of a method, according to an example.

FIG. 24 is a block diagram of a method, according to an example.

DETAILED DESCRIPTION

As noted above, a need exists for improved diagnostic circuits and improved diagnostic methods for analyzing electronic noise in cryogenic environments, such as the circuits and methods included in this disclosure.

A diagnostic circuit includes a superconducting quantum interference device (SQUID) configured to be (e.g., inductively) coupled to a test circuit such that an electronic noise present in the test circuit induces a first current that flows through the SQUID. The SQUID typically includes two Josephson junctions connected together to form a loop around which the first current flows. The test circuit generally takes the form of a CMOS circuit operating at a cryogenic temperature. The diagnostic circuit also includes a current path configured to receive a second current that flows through the SQUID. The SQUID is configured to generate an output in a form of: a first voltage in response to a sum of the first current and the second current being less than a threshold current, and a second voltage in response to the sum of the first current and the second current being greater than the threshold current.

A method of operating the diagnostic circuit includes generating the first current within the SQUID in response to the SQUID detecting the electronic noise within the test circuit. The method also includes increasing, while generating the first current, a magnitude of the second current that flows through the SQUID. The method also includes determining the magnitude of the second current at which an output of the SQUID transitions from the first voltage to the second voltage.

Accordingly, the output of the SQUID can indicate whether the sum of the first current induced by the electronic noise of the test circuit and the second current flowing through the current path is greater than or less than the threshold current of the SQUID. By controlling the magnitude of the second current flowing through the current path and noting the magnitude of the second current at which the output of the SQUID transitions, one can infer the magnitude of the first current that is induced by the electronic noise of the test circuit. By repeating this process many times, one can use statistical techniques to identify the character of the electronic noise of the test circuit. Thermal noise introduced by the room temperature analysis environment does not obscure the information indicated by the binary output of the SQUID.

Disclosed examples will now be described more fully hereinafter with reference to the accompanying Drawings, in which some, but not all of the disclosed examples are shown. Indeed, several different examples may be described and should not be construed as limited to the examples set forth herein. Rather, these examples are described so that this disclosure will be thorough and complete and will fully convey the scope of the disclosure to those skilled in the art.

Figure 1:
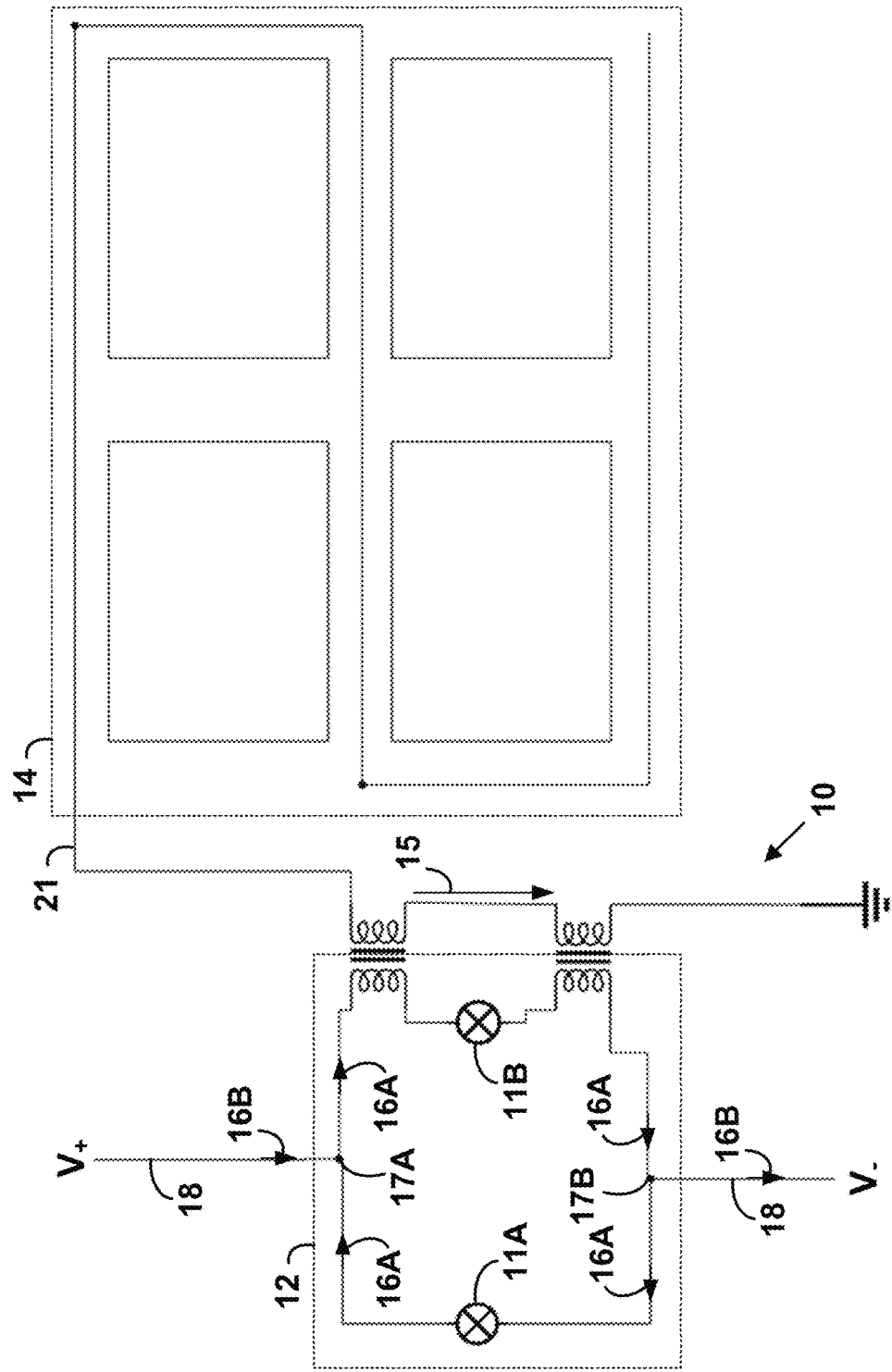
FIG. 1 is a schematic diagram of a diagnostic circuit and a test circuit, according to an example.

FIG. 1 is a schematic diagram of a diagnostic circuit 10 and a test circuit 14. The diagnostic circuit 10 includes a SQUID 12 that is (e.g., inductively) coupled to the test circuit 14 such that an electronic noise 15 present in the test circuit 14 induces a current 16A that flows through the SQUID 12. The diagnostic circuit 10 also includes a current path 18 configured to receive a current 16B that flows through the SQUID 12. The SQUID 12 is configured to generate an output V+, V− in a form of: a first voltage in response to a sum of the current 16A and the current 16B being less than a threshold current, and a second voltage in response to the sum of the current 16A and the current 16B being greater than the threshold current. The threshold current is typically on the order of microamps.

The SQUID 12 includes a Josephson junction 11A and a Josephson junction 11B. The SQUID 12 forms a superconducting loop that includes two different superconducting materials that meet at the Josephson junction 11A and the Josephson junction 11B. The length, width, shape, and cross sectional areas of the Josephson junction 11A and the Josephson junction 11B, the choice of materials that form the Josephson junction 11A and the Josephson junction 11B, and the operating temperature of the SQUID 12 all amount to design variables or constraints that determine the threshold current that corresponds to the SQUID 12.

The current path 18 is generally made of a superconducting material that is the same as one of the materials that forms the Josephson junction 11A and the Josephson junction 11B.

As shown, a test lead 21 is laid out in the vicinity of one more components of the test circuit 14 to capture the electronic noise 15 in the form of an induced electric current. The electronic noise 15 further induces the current 16A that flows within the loop of the SQUID 12. For the sake of clarity, only the current 16A is shown circulating the loop of the SQUID 12. However, portions of the current 16B transit the loop as well between entering and exiting the loop. The current 16B is generally controlled and provided by an external current source.

As noted above, the SQUID 12 will generate the output V+, V− in the form of a first voltage (e.g., 0 V) if the sum of the current 16A and the current 16B is less than the threshold current. The SQUID 12 will generate the output V+, V− in the form of a second voltage (e.g., 5 V) if the sum of the current 16A and the current 16B is greater than the threshold current. The SQUID 12 generates the output V+, V− between a terminal 17A and a terminal 17B of the SQUID 12. Typically, the first voltage corresponding to the sum of the current 16A and the current 16B being less than the threshold current is less than the second voltage corresponding to the sum of the current 16A and the current 16B being greater than the threshold current. In various examples, the test circuit 14 (e.g., a CMOS circuit) is operated in an environment cooled by liquid nitrogen and/or liquid helium.

In operation, the diagnostic circuit 10 generates the current 16A within the SQUID 12 in response to the SQUID 12 detecting the electronic noise 15 within the test circuit 14. While generating the current 16A, the diagnostic circuit 10 or an external current source increases a magnitude of the current 16B that flows through the SQUID 12. Additionally, a computing device and/or a voltmeter determines the magnitude of the current 16B at which the output V+, V− of the SQUID 12 transitions from the first voltage to the second voltage.

In some examples, the magnitude of the current 16B is increased at a linear rate (or another controlled rate) with respect to time while the diagnostic circuit 10 generates the current 16A within the SQUID 12. A computing device and/or a voltmeter determines a time at which the output V+, V− of the SQUID 12 transitions from the first voltage to the second voltage. The computing device then uses a magnitude of the current 16B at the beginning of the ramp process, the known ramp rate, and the time elapsed between the start of the ramp to the transition to infer what the magnitude of the current 16B is when the SQUID 12 transitions from the first voltage to the second voltage.

In some examples, the process of increasing the current 16B while generating the current 16A and determining the magnitude of the current 16B at which the output $V_+$, $V_-$ transitions from a first voltage to a second voltage is repeated multiple times. For example, the process could be repeated hundreds or thousands of times to obtain a statistically significant sample of data. That is, the obtained data can be used to determine an average value, a median value, a variance, or other metrics characterizing the electronic noise 15.

In some examples, the process of increasing the current 16B while generating the current 16A and determining the magnitude of the current 16B at which the output $V_+$, $V_-$ transitions from a first voltage to a second voltage is repeated multiple times using different ramp rates for the current 16B. For example, each process could use a successively increasing ramp rate for the current 16B. Varying the ramp rate of the current 16B can be useful for detecting electronic noise 15 of the test circuit 14 that occur at different varying frequencies.

Figure 2:
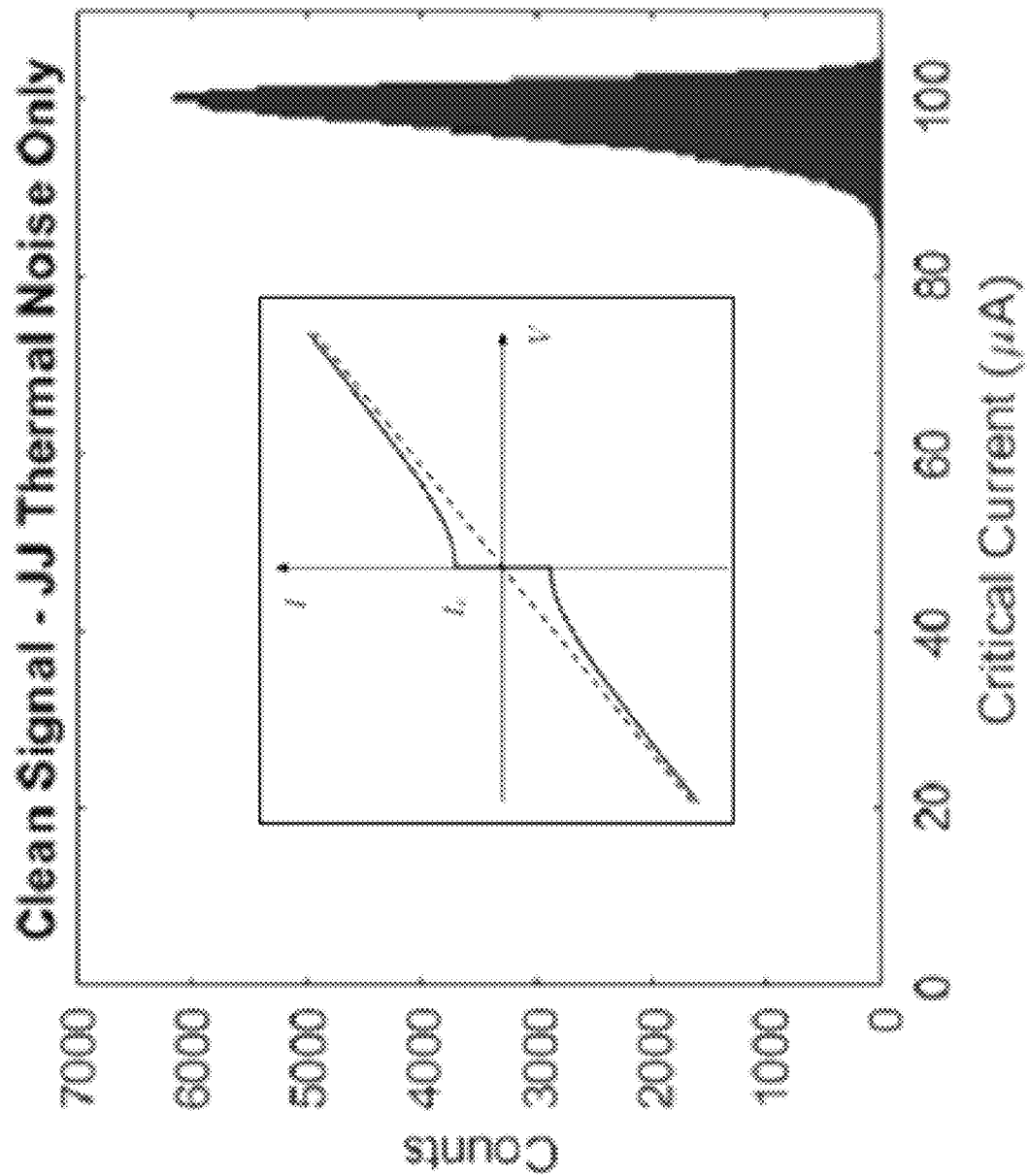
FIG. 2 shows a Gaussian distribution of magnitudes of currents that cause a transition of a SQUID, according to an example.

FIG. 2 shows a Gaussian distribution of magnitudes of the current 16B that cause a transition of the SQUID 12. In this example, the electronic noise 15 primarily takes the form of thermal noise. In this example, a magnitude of about 100 μA is the most common magnitude of the current 16B that causes a transition of the SQUID 12. If, at a given instant, the electronic noise 15 and the current 16A have a high value, a lesser magnitude of the current 16B will cause the output $V_+$, $V_-$ to transition from the first voltage to the second voltage. On the other hand, if the electronic noise 15 and the current 16A have a low value, a greater magnitude of the current 16B will cause the output $V_+$, $V_-$ to transition from the first voltage to the second voltage.

In some examples, it is useful to differentiate magnitudes of the current 16B that correspond to a Gaussian distribution and magnitudes of the current 16B that do not correspond to a Gaussian distribution. In FIG. 2, all of the magnitudes of the current 16B correspond to a Gaussian distribution which indicates that thermal activity is the primary cause of the electronic noise 15.

Figure 3:
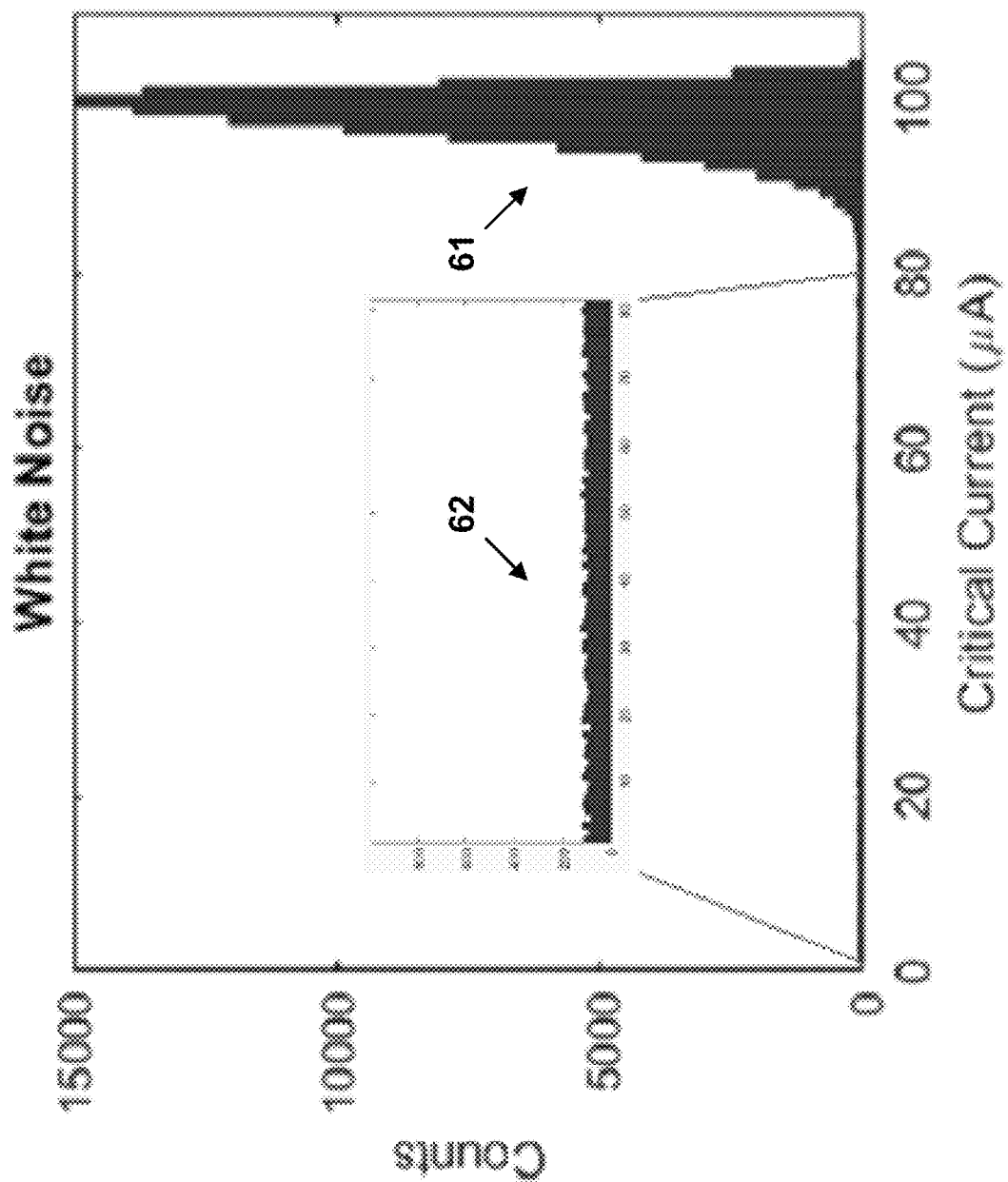
FIG. 3 shows a Gaussian distribution and a white noise distribution of magnitudes of currents that cause a transition of a SQUID, according to an example.

FIG. 3 shows another distribution of magnitudes of the current 16B that cause a transition of the SQUID 12. In this example, there is a Gaussian component 61 and a non-Gaussian component 62. The Gaussian component 61 represents thermal noise of the test circuit 14 whereas the non-Gaussian component 62 represents thermal noise of the diagnostic circuit 10 in the form of white noise.

Figure 4:
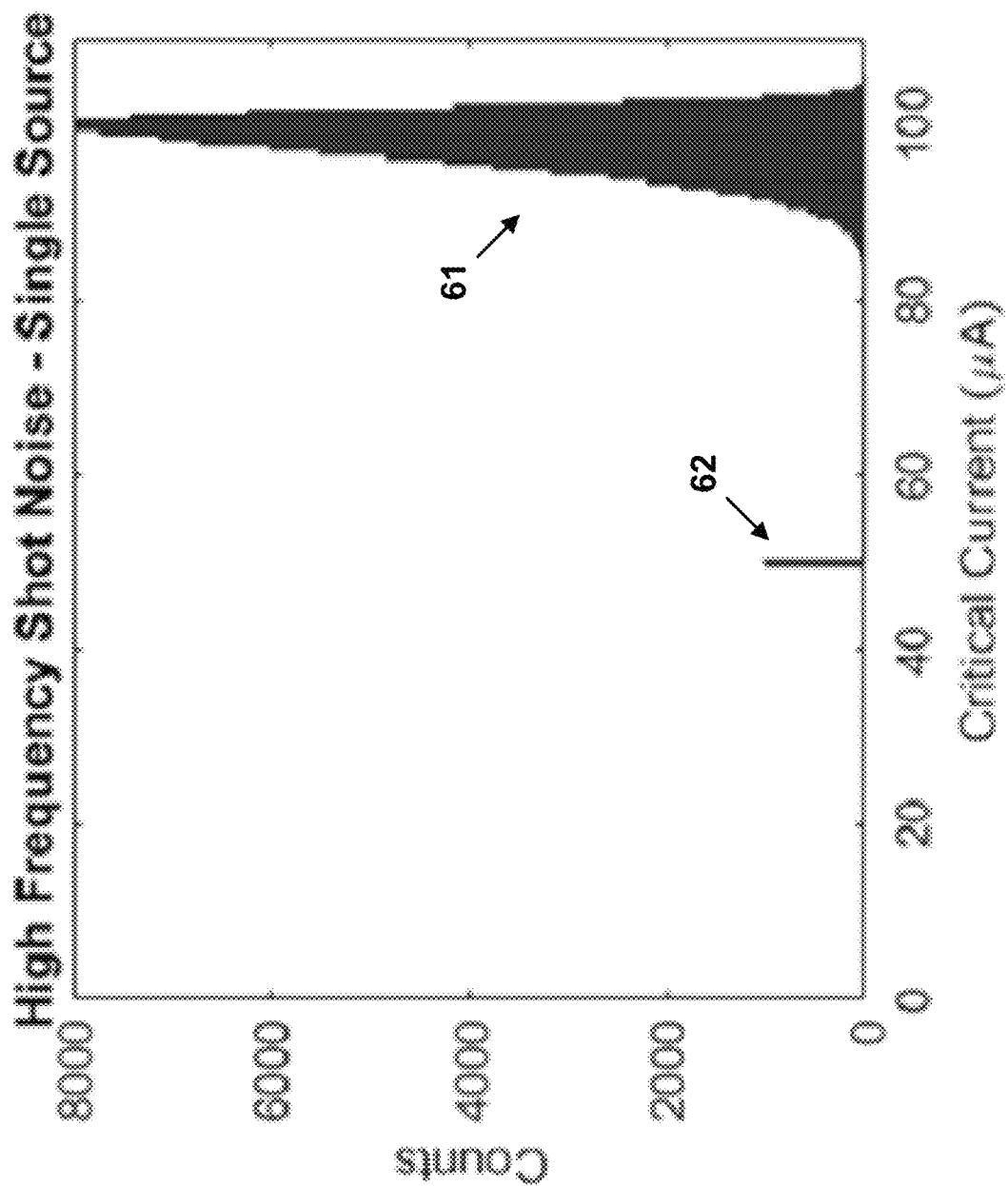
FIG. 4 shows a Gaussian distribution and a shot noise distribution of magnitudes of currents that cause a transition of a SQUID, according to an example.

FIG. 4 shows another distribution of magnitudes of the current 16B that cause a transition of the SQUID 12. In this example, there is a Gaussian component 61 and a non-Gaussian component 62. The Gaussian component 61 represents thermal noise of the test circuit 14 whereas the non-Gaussian component 62 represents thermal noise of the diagnostic circuit 10 in the form of a single source of shot noise.

Figure 5:
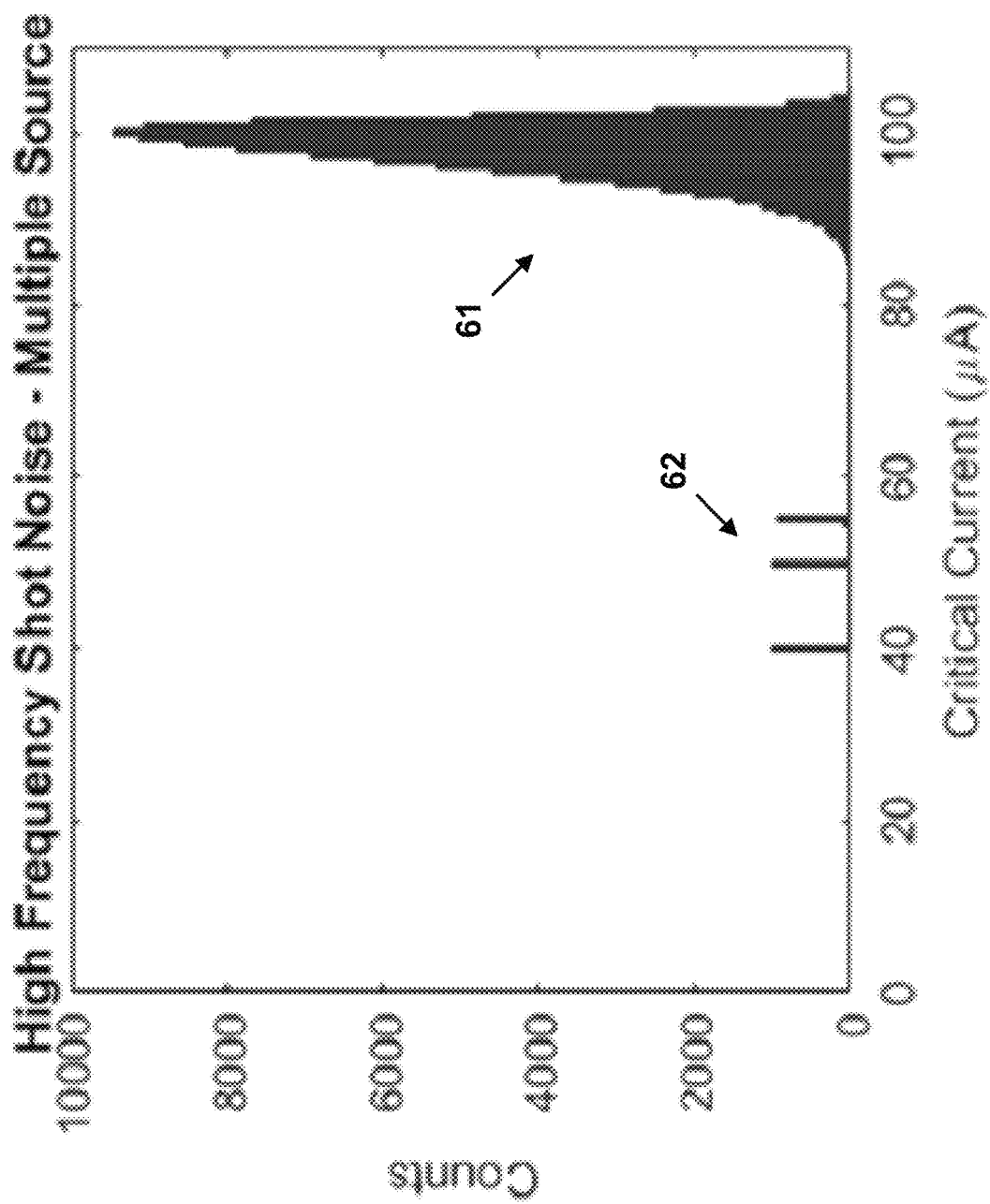
FIG. 5 shows a Gaussian distribution and a shot noise distribution of magnitudes of currents that cause a transition of a SQUID, according to an example.

FIG. 5 shows another distribution of magnitudes of the current 16B that cause a transition of the SQUID 12. In this example, there is a Gaussian component 61 and a non-Gaussian component 62. The Gaussian component 61 represents thermal noise of the test circuit 14 whereas the non-Gaussian component 62 represents thermal noise of the diagnostic circuit 10 in the form of multiple sources of shot noise.

Figure 6:
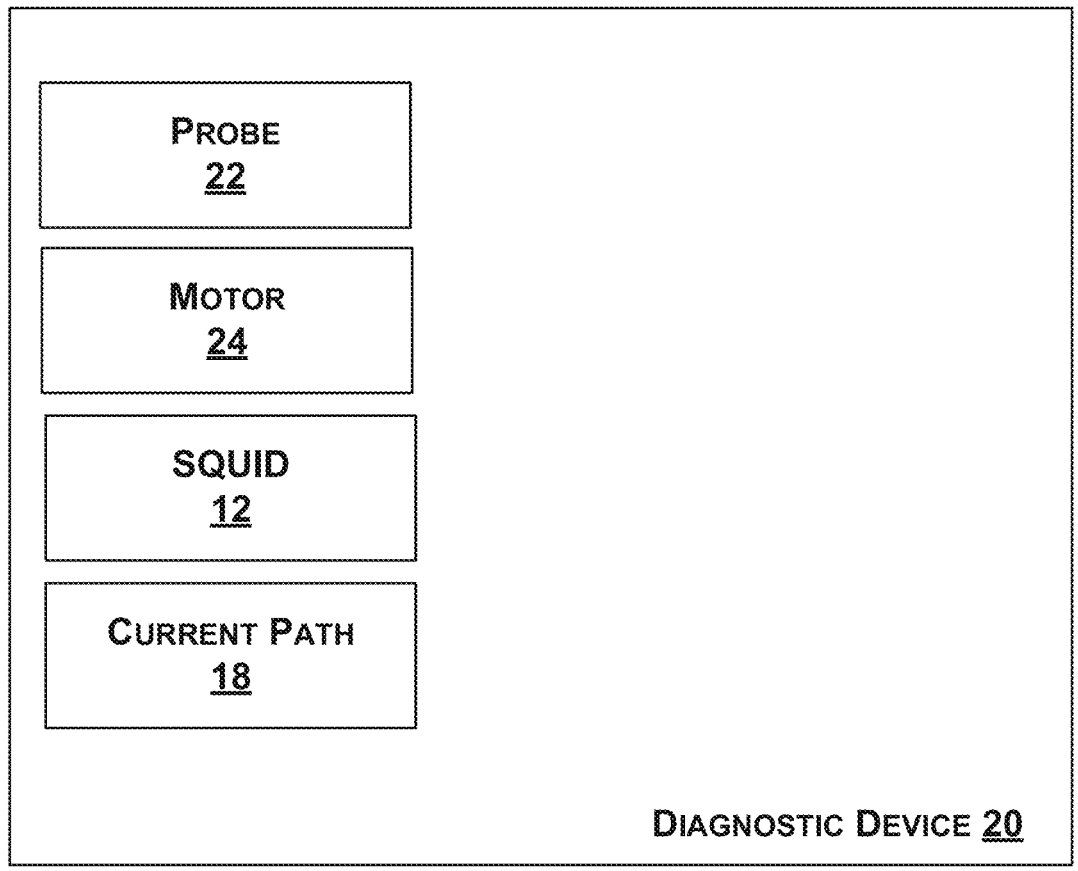
FIG. 6 is a block diagram of a diagnostic device, according to an example.

FIG. 6 is a block diagram of a diagnostic device 20. The diagnostic device 20 includes a probe 22, a motor 24, a SQUID 12, and a current path 18.

Figure 7:
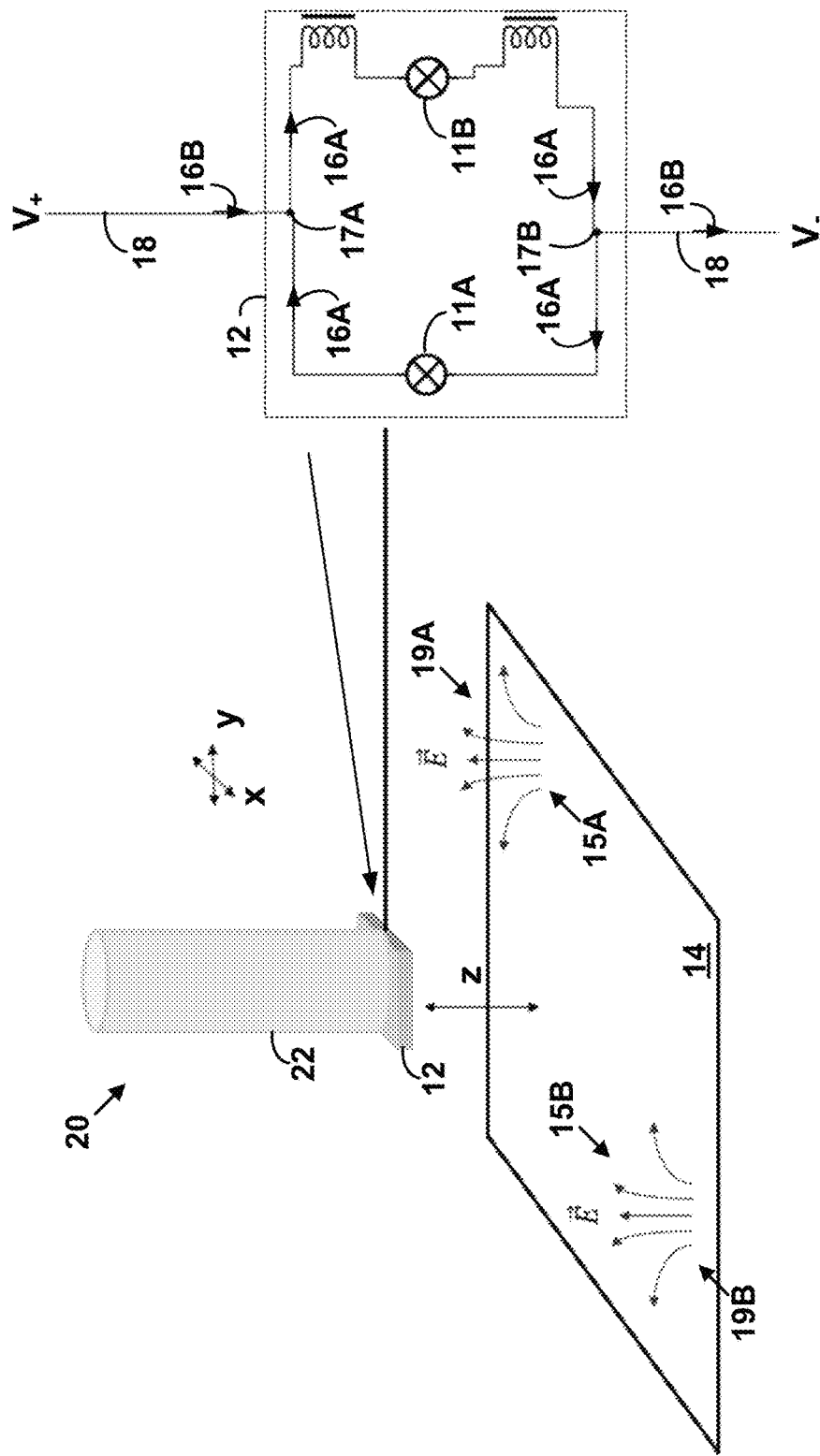
FIG. 7 is a schematic diagram of a diagnostic device and a test circuit, including an inset diagram of a SQUID, according to an example.

FIG. 7 is a schematic diagram of the diagnostic device 20 and the test circuit 14, including an inset diagram of the SQUID 12.

The motor 24 is configured to scan the probe 22 over the test circuit 14. The diagnostic device 20 also includes the SQUID 12 that is attached to the probe 22 and is configured to be (e.g., inductively) coupled to the test circuit 14 as the motor 24 moves the probe 22 to different positions over the test circuit 14.

Depending on the location of the probe 22 over the test circuit 14, the electronic noise 15A or the electronic noise 15B present in the test circuit 14 induces the current 16A that flows through the SQUID 12. The diagnostic device 20 also includes the current path 18 configured to receive the current 16B that flows through the SQUID 12. The SQUID 12 is configured to generate the output V+, V– in the form of: the first voltage in response to the sum of the current 16A and the current 16B being less than the threshold current, and a second voltage in response to the sum of the current 16A and the current 16B being greater than the threshold current.

The probe 22 generally takes the form of any probe used for scanning probe microscopy. The motor 24 generally takes the form of any motor that can control the position of the probe 22 in three dimensions with respect to the test circuit 14. The probe 22 can be scanned over the test circuit 14 using the motor 24 to analyze electronic noise 15 at different positions of the test circuit 14. That is, the motor 24 is configured to move the probe 22 along the x-axis and the y-axis that are orthogonal to each other and parallel to the test circuit 14. The motor 24 is also configured to move the probe 22 along the z-axis that is orthogonal to the x-axis, the y-axis, and the test circuit 14.

As shown, the SQUID 12 is scanned along with the probe 22 by the motor 24 to capture the electronic noise 15 in the form of an induced electric current. The electronic noise 15 further induces the current 16A that flows within the loop of the SQUID 12. The current 16B is generally controlled and provided by an external current source that is operatively coupled to the diagnostic device 20.

In operation, the motor 24 moves the probe 22 over a location 19A of the test circuit 14 such that the SQUID 12 generates the current 16A within the SQUID 12 in response to the SQUID 12 detecting the electronic noise 15A at the location 19A of the test circuit 14. The current 16B is increased via an external current source while the current 16A is generated. A computing device determines the magnitude of the current 16B at which the output V+, V– of the SQUID 12 transitions from the first voltage to the second voltage while the probe 22 was over the location 19A.

Next, the motor 24 moves the probe 22 over the location 19B of the test circuit 14 such that the SQUID 12 generates the current 16A in response to the SQUID 12 detecting the electronic noise 15B at the location 19B of the test circuit 14. The current 16B is increased via the external current source while the current 16A is generated. The computing device determines the magnitude of the current 16B at which the output V+, V– of the SQUID 12 transitions from the first voltage to the second voltage while the probe 22 was over the location 19B.

As noted above with reference to FIGS. 2-5, the process of increasing the current 16B while generating the current 16A and determining the magnitude of the current 16B at which the output $V_+$, $V_-$ transitions from a first voltage to a second voltage can be repeated multiple times for the location 19A and multiple times for the location 19B. For example, the process could be repeated hundreds or thousands of times for each location to obtain a statistically significant sample of data for each location. That is, the obtained data can be used to determine an average value, a median value, a variance, or other metrics characterizing the electronic noise 15 at each location. As noted above with reference to FIGS. 2-5, the magnitudes of the current 16B that cause the transition at each location can be classified as corresponding or not corresponding to a Gaussian distribution. Likewise, the aforementioned process of using different ramp rates of the current 16B can be used at each location as well.

Figure 8:
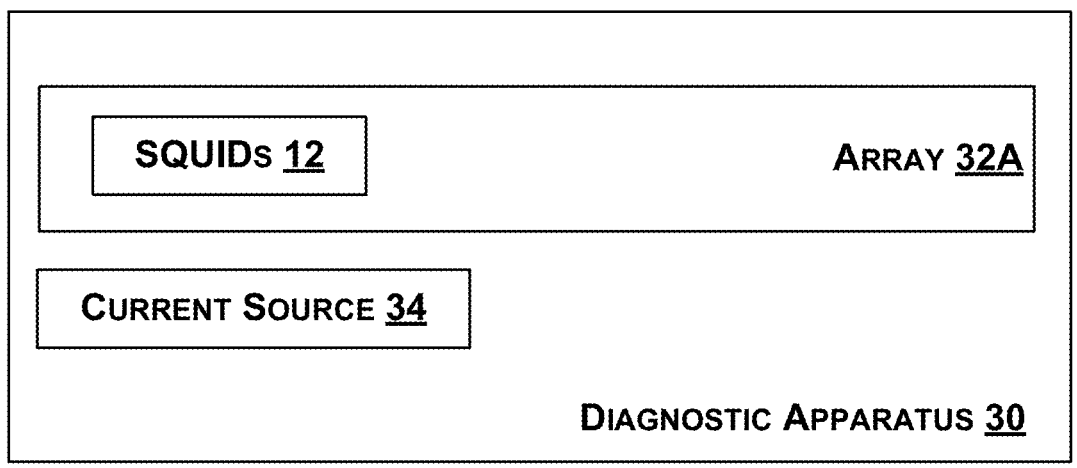
FIG. 8 is a block diagram of a diagnostic apparatus, according to an example.

FIG. 8 is a block diagram of a diagnostic apparatus 30. The diagnostic apparatus 30 includes an array 32A of SQUIDs 12. The diagnostic apparatus 30 also includes a current source 34. The current source 34 can include any circuit that is controllable to generate a desired current magnitude and provide that current to another circuit.

Figure 9:
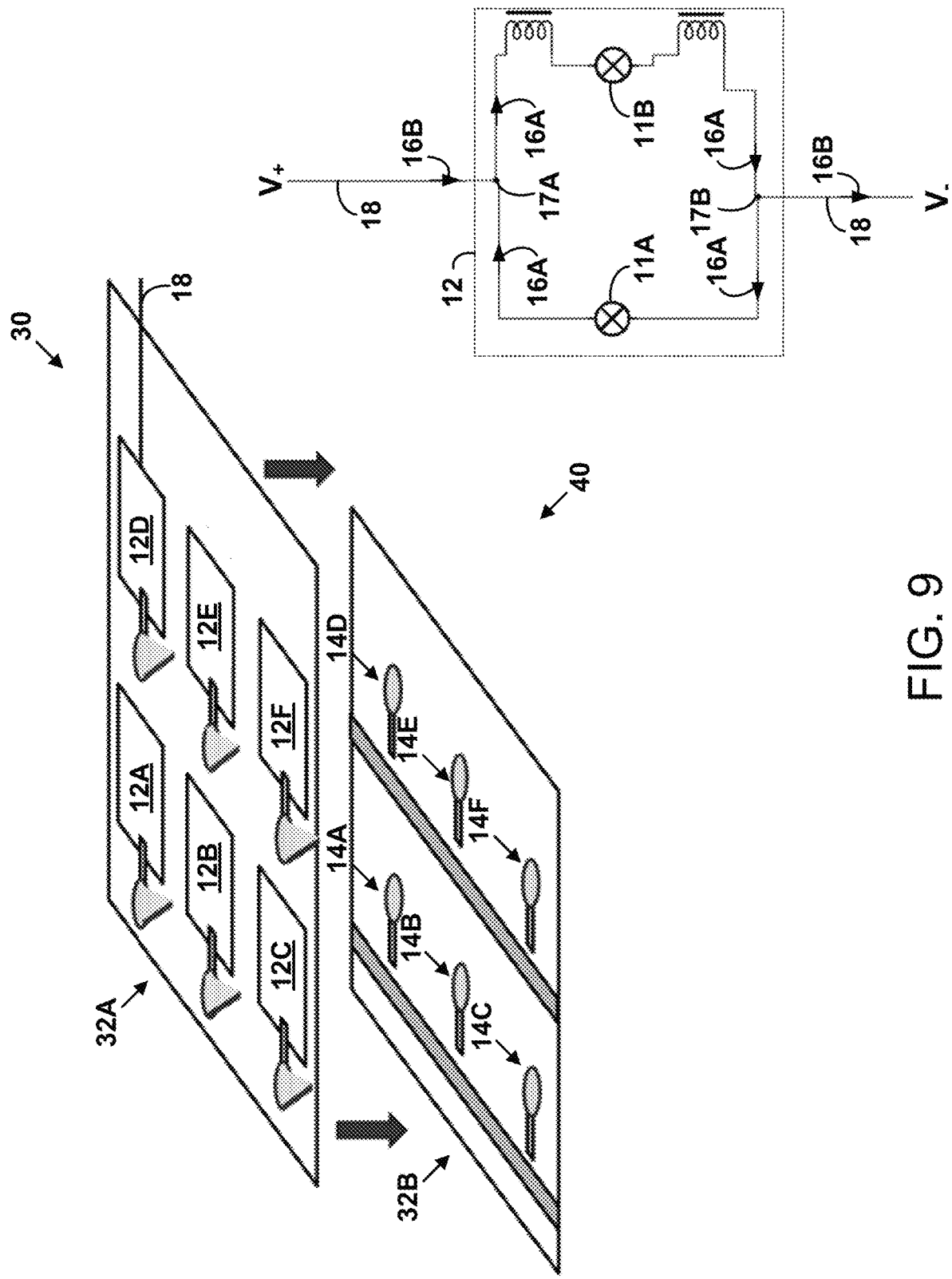
FIG. 9 is a schematic diagram of a diagnostic system that includes a diagnostic apparatus, according to an example.

FIG. 9 is a schematic diagram of a diagnostic system 40 that includes the diagnostic apparatus 30. The diagnostic system 40 includes an array 32B of test circuits 14A-F and an array 32A of SQUIDs 12A-F. When the array 32A is positioned suitably over the array 32B, each SQUID 12A-F of the array 32A is (e.g., inductively) coupled respectively to a test circuit 14A-F of the array 32B such that an electronic noise present in the test circuits 14A-F induces the currents 16A that flow through the respective SQUIDs 12A-F. The diagnostic system 40 also includes the current source 34 (e.g., a multi-output current source) configured to provide the currents 16B for each SQUID 12A-F of the array 32A such that the currents 16B flow respectively through the SQUIDs 12A-F. Each SQUID 12A-F of the array 32A is configured to generate its own output V+, V− in the form of: a first voltage (e.g., 0 V) in response to a sum of the current 16A and the current 16B being less than the threshold current, and a second voltage (e.g., 5 V) in response to the sum of the current 16A and the current 16B being greater than the threshold current.

In operation, the diagnostic apparatus 30 generates, for each SQUID 12A-F of the array 32A and a corresponding test circuit 14A-F of the array 32B, the current 16A within the SQUID 12A-F in response to detecting an electronic noise 15 respectively within the test circuit 14A-F. While generating the currents 16A within the SQUIDs 12A-F, the diagnostic apparatus 30 (e.g., the current source 34) increases the magnitudes of the currents 16B flowing through the respective SQUIDs 12A-F. Additionally, a computing device and/or a voltmeter determines, for each SQUID 12A-F of the array 32A, the magnitude of the current 16B at which the output V+, V− of the SQUID 12A-F transitions from the first voltage to the second voltage.

Figure 10:
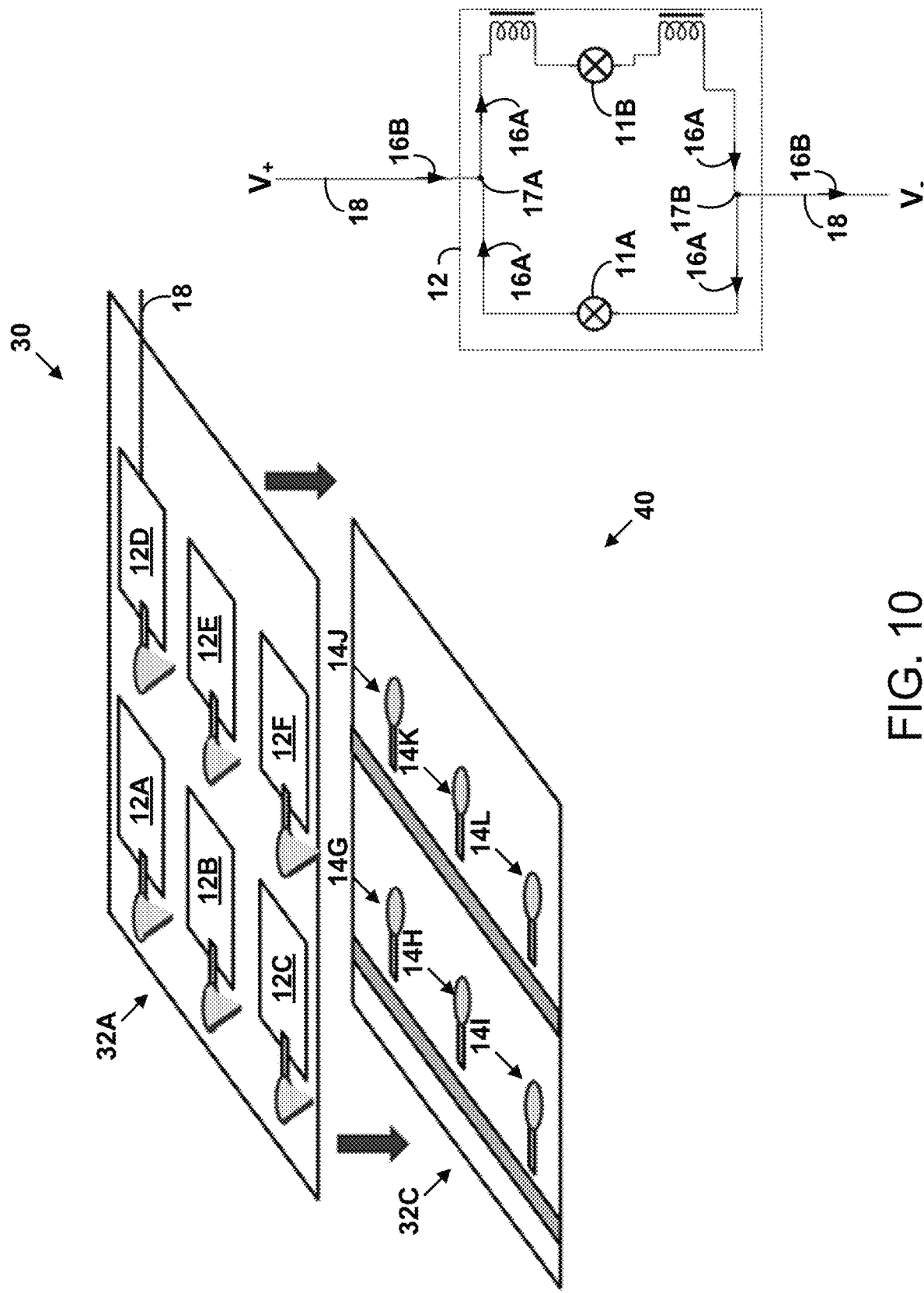
FIG. 10 is a schematic diagram of a diagnostic system that includes a diagnostic apparatus, according to an example, according to an example.
Figure 11:
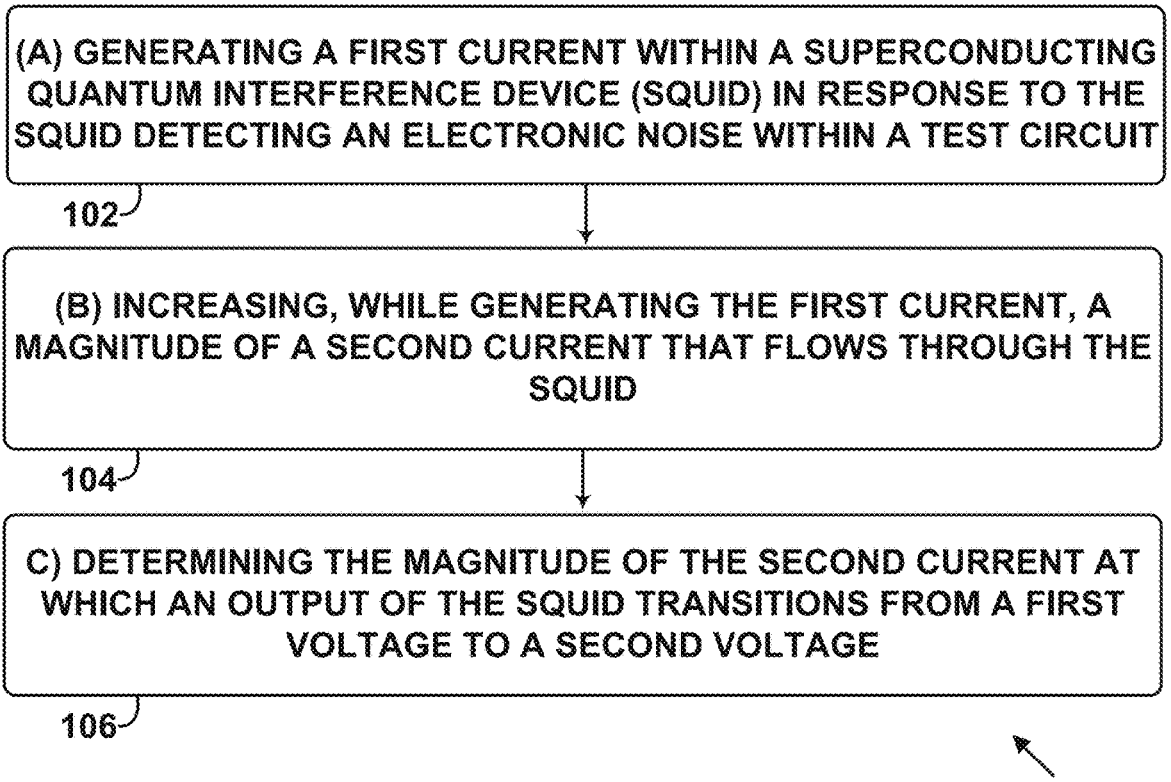
FIG. 11 is a block diagram of a method, according to an example.
Figure 12:
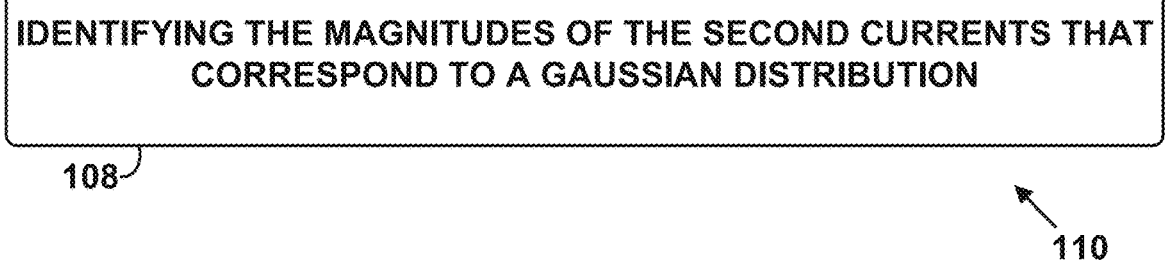
FIG. 12 is a block diagram of a method, according to an example.
Figure 15:
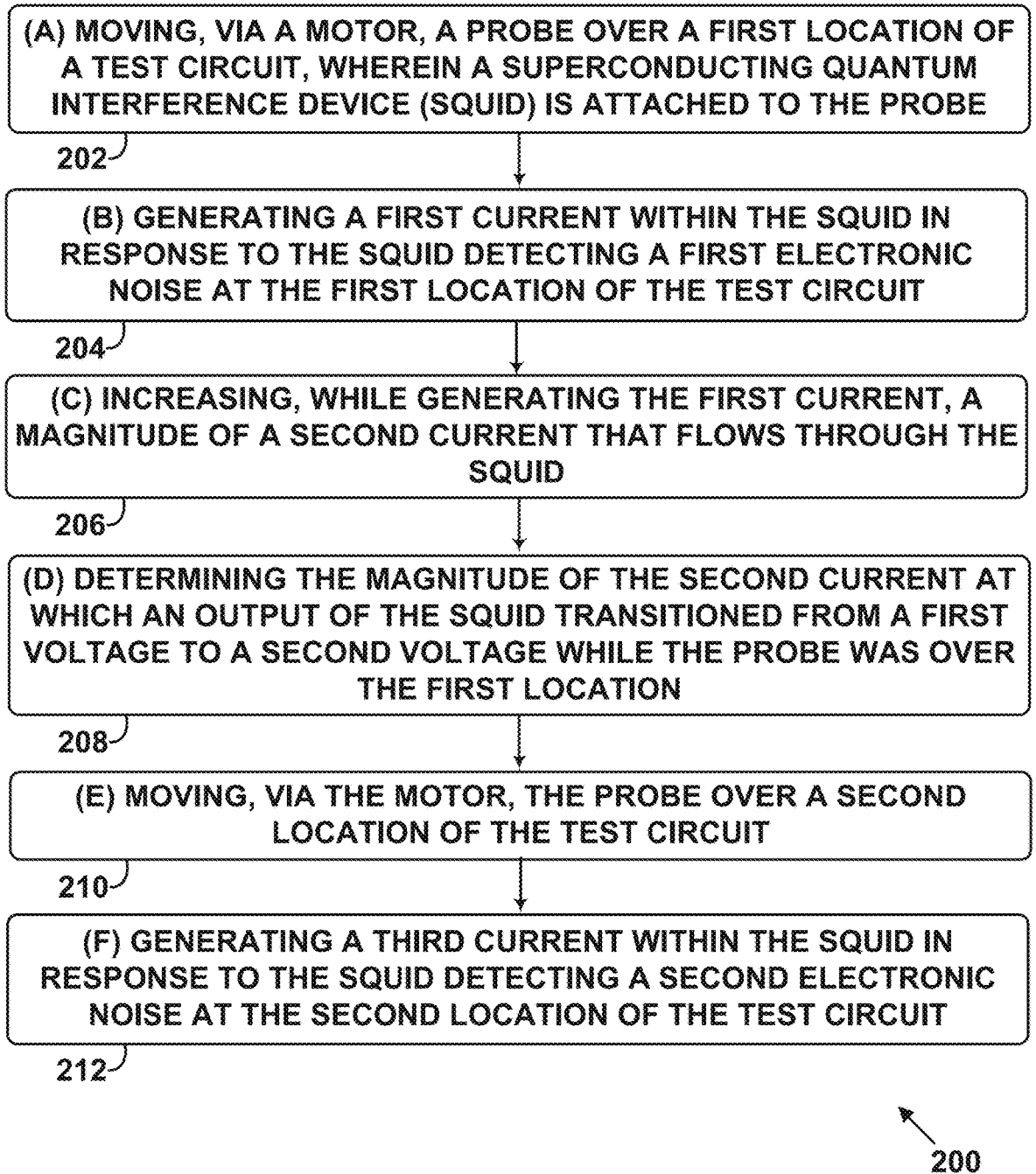
FIG. 15 is a block diagram of a method, according to an example.
Figure 16:
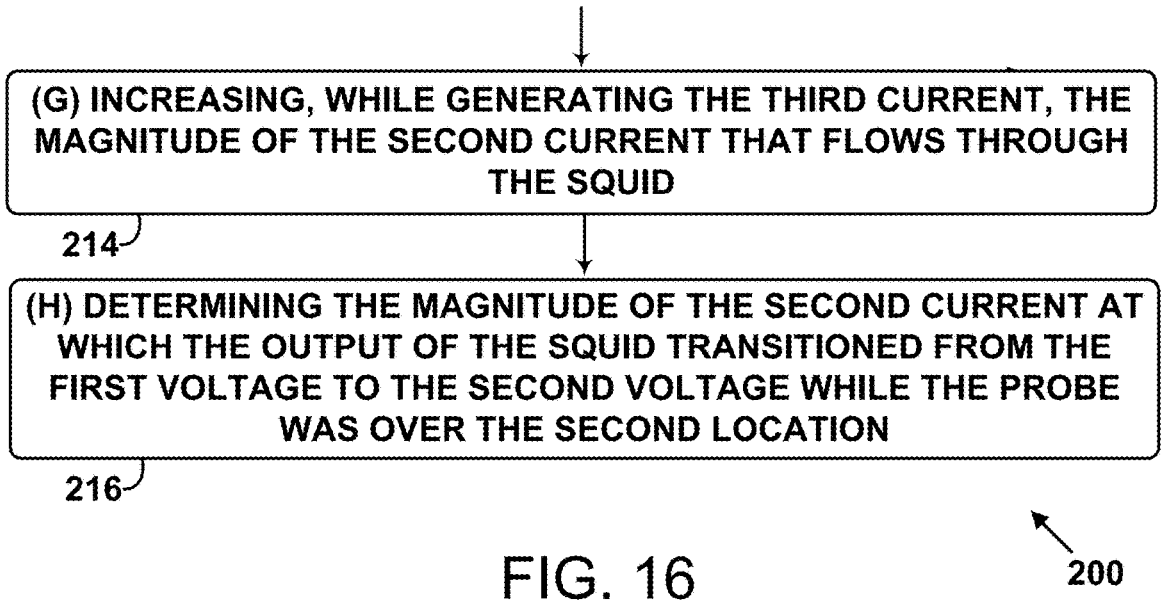
FIG. 16 is a block diagram of a method, according to an example.
Figure 17:
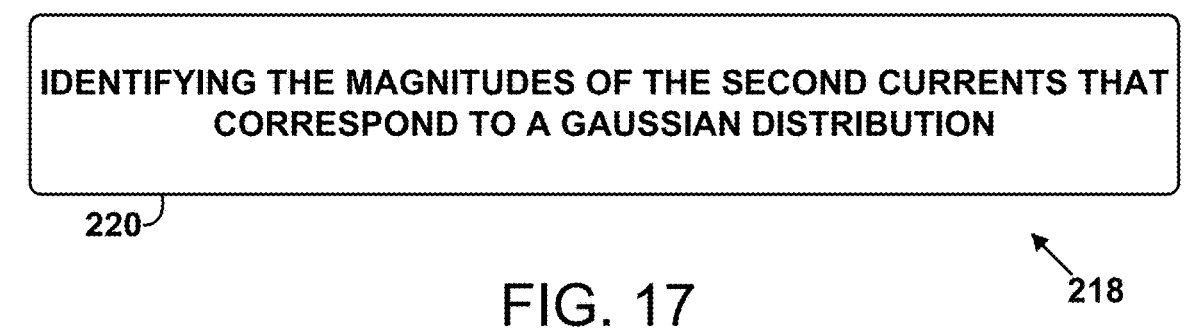
FIG. 17 is a block diagram of a method, according to an example.
Figure 18:
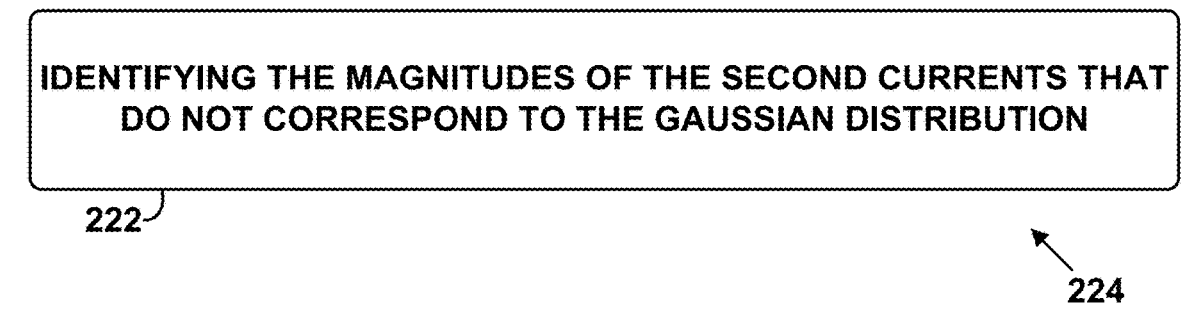
FIG. 18 is a block diagram of a method, according to an example.
Figure 21:
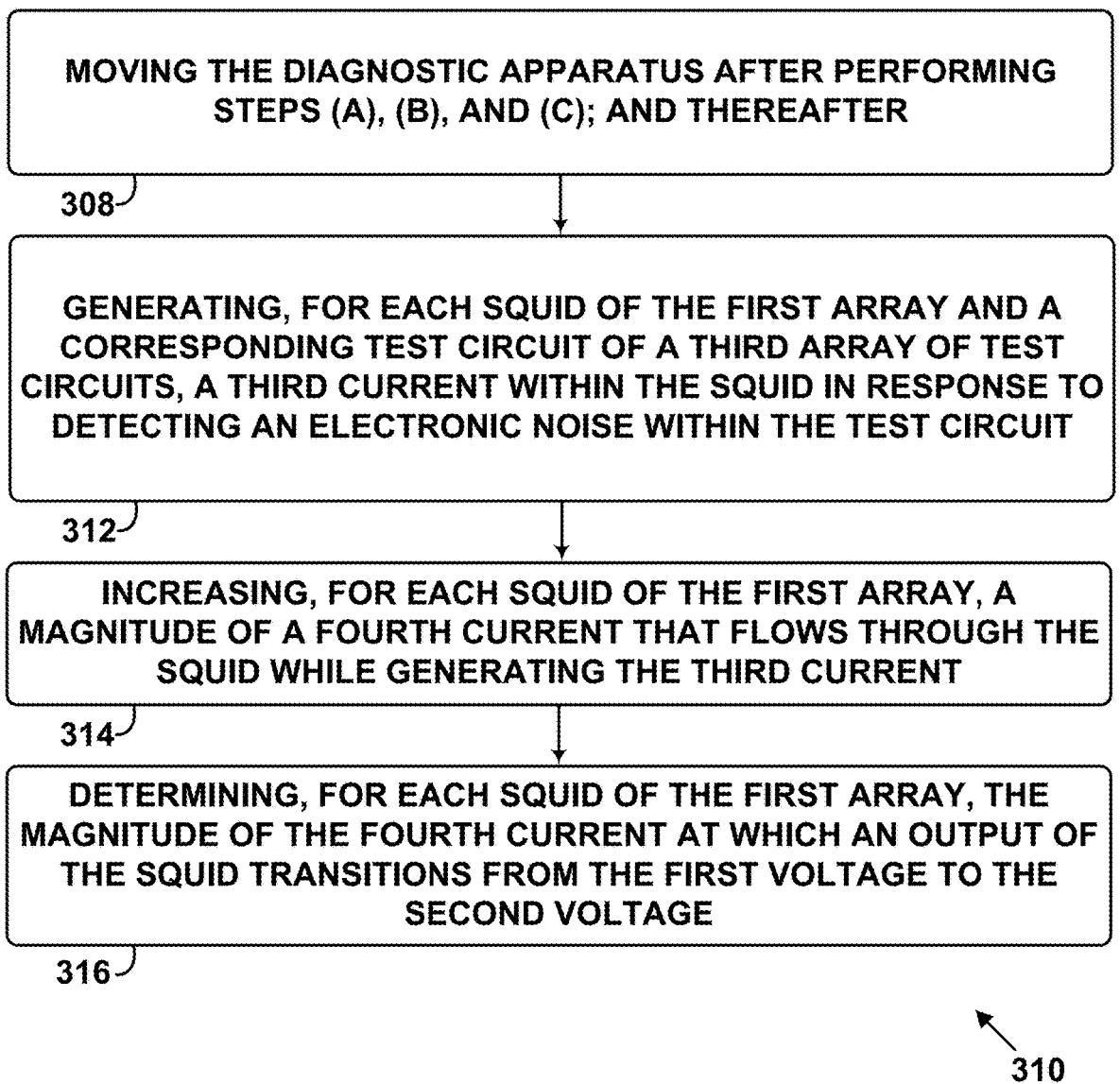
FIG. 21 is a block diagram of a method, according to an example.

Referring to FIG. 10, the diagnostic apparatus 30 is used to analyze a new array of test circuits 14. As such, the diagnostic apparatus 30 is moved to be in close proximity to an array 32C of test circuits 14G-L. Accordingly, the diagnostic apparatus 30 generates, for each SQUID 12A-F of the array 32A and a corresponding test circuit 14G-L of the array 32C, the current 16A within the SQUID 12A-F in response to detecting an electronic noise 15 respectively within the test circuits 14G-L. While generating the currents 16A within the SQUIDs 12A-F, the diagnostic apparatus 30 (e.g., the current source 34) increases the magnitudes of the currents 16B flowing through the respective SQUIDs 12A-F. Additionally, a computing device and/or a voltmeter determines, for each SQUID 12A-F of the array 32A, the magnitude of the current 16B at which the output V+, V− of the SQUID 12A-F transitions from the first voltage to the second voltage.

As noted above with reference to FIGS. 2-5, the process of increasing the current 16B while generating the current 16A and determining the magnitude of the current 16B at which the output $V_+$, $V_-$ transitions from the first voltage to the second voltage can be repeated multiple times for each test circuit 14A-F of the array 32B and multiple times for each test circuit 14G-L of the array 32C. For example, the process could be repeated hundreds or thousands of times for each test device of each array to obtain a statistically significant sample of data for each test device of each array. That is, the obtained data can be used to determine an average value, a median value, a variance, or other metrics characterizing the electronic noise 15 at each test device of each array.

As noted above with reference to FIGS. 2-5, the respective magnitudes of the current 16B that causes the transition of each SQUID of each array can be classified as corresponding or not corresponding to a Gaussian distribution. Likewise, the aforementioned process of using different ramp rates of the current 16B can be used for each SQUID of each array as well.

FIGS. 11-14 are block diagrams of a method 100, a method 110, a method 114, and a method 118 of operating the diagnostic circuit 10. FIGS. 15-19 are block diagrams of a method 200, a method 218, a method 224, and a method 228 of operating the diagnostic device 20. FIGS. 20-24 are block diagrams of a method 300, a method 310, a method 322, a method 324, and a method 326 for operating the diagnostic apparatus 30. As shown in FIGS. 11-24, the methods 200-326 include one or more operations, functions, or actions as illustrated by blocks 102, 104, 106, 108, 112, 116, 202, 204, 206, 208, 210, 212, 214, 216, 220, 222, 226, 302, 304, 306, 308, 312, 314, 316, 318, 320, and 328. Although the blocks are illustrated in a sequential order, these blocks may also be performed in parallel, and/or in a different order than those described herein. Also, the various blocks may be combined into fewer blocks, divided into additional blocks, and/or removed based upon the desired implementation.

At block 102, the method 100 includes (a) generating the current 16A within the SQUID 12 in response to the SQUID 12 detecting the electronic noise 15 within a test circuit 14. Functionality related to block 102 is discussed above with reference to FIG. 1.

At block 104, the method 100 includes (b) increasing, while generating the current 16A, the magnitude of the current 16B that flows through the SQUID 12. Functionality related to block 104 is discussed above with reference to FIG. 1.

At block 106, the method 100 includes (c) determining the magnitude of the current 16B at which the output V+, V− of the SQUID 12 transitions from the first voltage to the second voltage. Functionality related to block 106 is discussed above with reference to FIGS. 1-5.

At block 108, the method 110 includes identifying the magnitudes of the currents 16B that correspond to a Gaussian distribution. Functionality related to block 108 is discussed above with reference to FIGS. 2-5.

At block 112, the method 114 includes identifying the magnitudes of the currents 16B that do not correspond to the Gaussian distribution. Functionality related to block 112 is discussed above with reference to FIGS. 3-5.

At block 116, the method 118 includes performing steps (a), (b), and (c) a second time, wherein the second time performing step (b) comprises increasing the magnitude of the current 16B at a second rate that is greater than the first rate. Functionality related to block 116 is discussed above with reference to FIG. 1.

At block 202, the method 200 includes (a) moving, via the motor 24, the probe 22 over the location 19A of the test circuit 14, where the SQUID 12 is attached to the probe 22. Functionality related to block 202 is discussed above with reference to FIG. 7.

At block 204, the method 200 includes (b) generating the current 16A within the SQUID 12 in response to the SQUID 12 detecting the electronic noise 15A at the location 19A of the test circuit 14. Functionality related to block 204 is discussed above with reference to FIG. 7.

At block 206, the method 200 includes (c) increasing, while generating the current 16A, the magnitude of the current 16B that flows through the SQUID 12. Functionality related to block 206 is discussed above with reference to FIG. 7.

At block 208, the method 200 includes (d) determining the magnitude of the current 16B at which the output $V_+$, $V_-$ of the SQUID 12 transitioned from the first voltage to the second voltage while the probe 22 was over the location 19A. Functionality related to block 208 is discussed above with reference to FIG. 7.

At block 210, the method 200 includes (e) moving, via the motor 24, the probe 22 over the location 19B of the test circuit 14. Functionality related to block 210 is discussed above with reference to FIG. 7.

At block 212, the method 200 includes (f) generating the current 16A within the SQUID 12 in response to the SQUID 12 detecting the electronic noise 15B at the location 19B of the test circuit 14. Functionality related to block 212 is discussed above with reference to FIG. 7.

At block 214, the method 200 includes (g) increasing, while generating the current 16A, the magnitude of the current 16B that flows through the SQUID 12. Functionality related to block 214 is discussed above with reference to FIG. 7.

At block 216, the method 200 includes (h) determining the magnitude of the current 16B at which the output $V_+$, $V_-$ of the SQUID 12 transitioned from the first voltage to the second voltage while the probe 22 was over the location 19B. Functionality related to block 216 is discussed above with reference to FIG. 7.

At block 220, the method 218 includes identifying the magnitudes of the currents 16B that correspond to a Gaussian distribution. Functionality related to block 220 is discussed above with reference to FIGS. 2-5.

At block 222, the method 224 includes identifying the magnitudes of the currents 16B that do not correspond to the Gaussian distribution. Functionality related to block 222 is discussed above with reference to FIGS. 3-5.

At block 226, the method 228 includes performing steps (b), (c), and (d) a second time, wherein the second time performing step (c) comprises increasing the magnitude of the current 16B at a second rate that is greater than the first rate. Functionality related to block 222 is discussed above with reference to FIG. 7.

At block 302, the method 300 includes (a) generating, for each SQUID 12A-F of the array 32A of SQUIDs 12A-F and a corresponding test circuit 14A-F of the array 32B of test circuits 14A-F, the current 16A within the SQUID 12 in response to detecting the electronic noise 15 within the test circuit 14. Functionality related to block 302 is discussed above with reference to FIG. 9.

At block 304, the method 300 includes (b) increasing, for each SQUID 12A-F of the array 32A, the magnitude of the current 16B that flows through the SQUID 12A-F while generating the current 16A. Functionality related to block 304 is discussed above with reference to FIG. 9.

At block 306, the method 300 includes (c) determining, for each SQUID 12A-F of the array 32A, the magnitude of the current 16B at which the output V+, V− of the SQUID 12A-F transitions from the first voltage to the second voltage. Functionality related to block 306 is discussed above with reference to FIG. 9.

At block 308, the method 310 includes moving the diagnostic apparatus 30 after performing steps (a), (b), and (c). Functionality related to block 308 is discussed above with reference to FIG. 9 and FIG. 10.

At block 312, the method 310 includes generating, for each SQUID 12A-F of the array 32A and a corresponding test circuit 14G-J of the array 32C of test circuits 14G-J, the current 16A within the SQUID 12A-F in response to detecting the electronic noise 15 within the test circuit 14G-J. Functionality related to block 312 is discussed above with reference to FIG. 10.

At block 314, the method 310 includes increasing, for each SQUID 12A-F of the array 32A, the magnitude of the current 16B that flows through the SQUID 12A-F while generating the current 16A. Functionality related to block 314 is discussed above with reference to FIG. 10.

At block 316, the method 310 includes determining, for each SQUID 12A-F of the array 32A, the magnitude of the current 16B at which the output $V_+$, $V_-$ of the SQUID 12A-F transitions from the first voltage to the second voltage. Functionality related to block 316 is discussed above with reference to FIG. 10.

At block 318, the method 322 includes identifying, for each test circuit 14-A-F of the array 32B, the magnitudes of the currents 16B that correspond to a Gaussian distribution. Functionality related to block 318 is discussed above with reference to FIGS. 2-5.

At block 320, the method 324 includes identifying, for each test circuit 14-A-F of the array 32B, the magnitudes of the currents 16B that do not correspond to the Gaussian distribution. Functionality related to block 320 is discussed above with reference to FIGS. 3-5.

At block 328, the method 326 includes performing steps (a), (b), and (c) a second time, wherein the second time performing step (b) comprises increasing the magnitude of the current 16B at a second rate that is greater than the first rate. Functionality related to block 328 is discussed above with reference to FIG. 9.

The description of the different advantageous arrangements has been presented for purposes of illustration and description, and is not intended to be exhaustive or limited to the examples in the form disclosed. Many modifications and variations will be apparent to those of ordinary skill in the art. Further, different advantageous examples may describe different advantages as compared to other advantageous examples. The example or examples selected are chosen and described in order to explain the principles of the examples, the practical application, and to enable others of ordinary skill in the art to understand the disclosure for various examples with various modifications as are suited to the particular use contemplated.

What is claimed is:
1. A diagnostic circuit comprising:
 a superconducting quantum interference device (SQUID) configured to be coupled to a test circuit such that an electronic noise present in the test circuit induces a first current that flows through the SQUID; and
 a current path configured to receive a second current that flows through the SQUID, wherein the SQUID is configured to generate an output in a form of:
  a first voltage in response to a sum of the first current and the second current being less than a threshold current, and a second voltage in response to the sum of the first current and the second current being greater than the threshold current.

2. The diagnostic circuit of claim 1, wherein the test circuit is configured to operate in an environment cooled by liquid nitrogen.

3. The diagnostic circuit of claim 1, wherein the test circuit is configured to operate in an environment cooled by liquid helium.

4. The diagnostic circuit of claim 1, wherein the SQUID is configured to be inductively coupled to the test circuit.

5. The diagnostic circuit of claim 1, wherein the SQUID comprises a first terminal and a second terminal and the SQUID is configured to generate the output between the first terminal and the second terminal.

6. The diagnostic circuit of claim 1, wherein the first voltage is substantially equal to zero.

7. The diagnostic circuit of claim 1, wherein the first voltage is less than the second voltage.

8. The diagnostic circuit of claim 1, wherein the test circuit comprises a complementary metal-oxide semiconductor (CMOS) circuit.

9. A method of operating a diagnostic circuit, the method comprising:
  (a) generating a first current within a superconducting quantum interference device (SQUID) in response to the SQUID detecting an electronic noise within a test circuit,
    wherein the SQUID is configured to be coupled to the test circuit such that the electronic noise present in the test circuit induces the first current that flows through the SQUID;
  (b) increasing, while generating the first current, a magnitude of a second current that flows through the SQUID,
    wherein a current path is configured to receive the second current that flows through the SQUID; and
  (c) determining the magnitude of the second current at which an output of the SQUID transitions from a first voltage to a second voltage,
    wherein the first voltage is output in response to a sum of the first current and the second current being less than a threshold current, and
    the second voltage is output in response to the sum of the first current and the second current being greater than the threshold current.

10. The method of claim 9, wherein the method comprises performing steps (a), (b), and (c) at least two times.

11. The method of claim 10, further comprising identifying the magnitudes of the second currents that correspond to a Gaussian distribution.

12. The method of claim 11, further comprising identifying the magnitudes of the second currents that do not correspond to the Gaussian distribution.

13. The method of claim 9, wherein increasing the magnitude of the second current comprises increasing the magnitude at a first rate, the method further comprising performing steps (a), (b), and (c) a second time, wherein the second time performing step (b) comprises increasing the magnitude at a second rate that is greater than the first rate.

14. The method of claim 9, wherein the method is performed while the test circuit is being cooled by liquid nitrogen.

15. The method of claim 9, wherein the method is performed while the test circuit is being cooled by liquid helium.

16. The method of claim 9, wherein generating the first current comprises generating the first current via inductive coupling between the SQUID and the test circuit.

17. The method of claim 9, wherein the first voltage is substantially equal to zero.

18. The method of claim 9, wherein the first voltage is less than the second voltage.

19. The method of claim 9, wherein the second voltage is greater than zero.

20. The method of claim 9, wherein the test circuit comprises a complementary metal-oxide semiconductor (CMOS) circuit.

* * * * *